United States Patent [19]

Risinger et al.

[11] Patent Number: 5,489,862
[45] Date of Patent: Feb. 6, 1996

[54] OUTPUT DRIVER WITH SLEW AND SKEW RATE CONTROL

[75] Inventors: Vance Risinger, Van Alstyne; James C. Spurlin, Sherman, both of Tex.

[73] Assignee: Texas Instruments Incorporated, Dallas, Tex.

[21] Appl. No.: 341,791

[22] Filed: Nov. 18, 1994

[51] Int. Cl.$^6$ ................................................. H03K 3/00
[52] U.S. Cl. ............................ 327/108; 326/83; 327/530
[58] Field of Search ................................ 327/108, 109, 327/110, 111; 326/82, 83, 89; 327/530

[56] References Cited

U.S. PATENT DOCUMENTS

| | | | |
|---|---|---|---|
| 3,688,208 | 8/1972 | Kandiah | 330/13 |
| 3,868,517 | 2/1975 | Shoeff | 307/235 R |
| 4,065,678 | 12/1977 | Reese et al. | 307/237 |
| 4,331,886 | 5/1982 | Perner et al. | 327/108 |
| 5,124,570 | 6/1992 | Meno et al. | |
| 5,293,081 | 3/1994 | Chiao et al. | 307/270 |
| 5,293,082 | 3/1994 | Bathaee | 307/270 |
| 5,311,077 | 5/1994 | Brown | 307/443 |
| 5,313,109 | 5/1994 | Smith | 307/270 |
| 5,376,833 | 12/1994 | Chloupek | 327/108 |
| 5,376,846 | 12/1994 | Houston | 327/108 |

Primary Examiner—Timothy P. Callahan
Assistant Examiner—Kenneth B. Wells
Attorney, Agent, or Firm—Mark E. Courtney; W. James Brady, III; Richard L. Donaldson

[57] ABSTRACT

An output driver circuit for use with low voltage level, high speed data transmission busses which require slew and skew control of the output voltage transitions. An open collector output transistor has a controlled slew rate for both the high to low and low to high output transitions. The slew rate control is provided by controlling the slew rate of the base voltage of the output transistor in response to an input transition. A slew rate control circuit coupled to the output transistor includes a current source powered by a high stability bias generator, one or more output feedback circuits, an output level compensation circuit, and a base discharge circuit. The current source controls the amount of current available at the base of the open collector output transistor. The feedback circuits are used to control the initial voltage at the base of the output transistor, and the slew rate for the rising voltage at the base of the output transistor. The output level compensation circuit is used to vary the current into the base of the output driving transistor when the low output voltage level crosses certain predetermined thresholds. The discharge circuit is used to control the rise time when the output voltage transistors from a low to a high output level. The resulting circuit has a fast transition time in response to an input transition combined with a tightly controlled slew rates and skew. The output driver circuit described can meet the proposed specifications for the low voltage level, fast transition busses currently being developed.

22 Claims, 3 Drawing Sheets

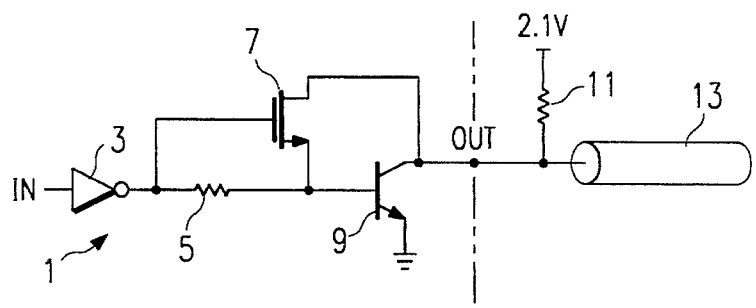
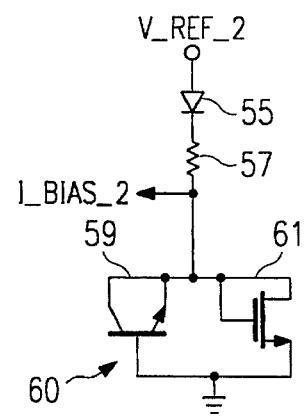
FIG. 1 (PRIOR ART)
FIG. 3
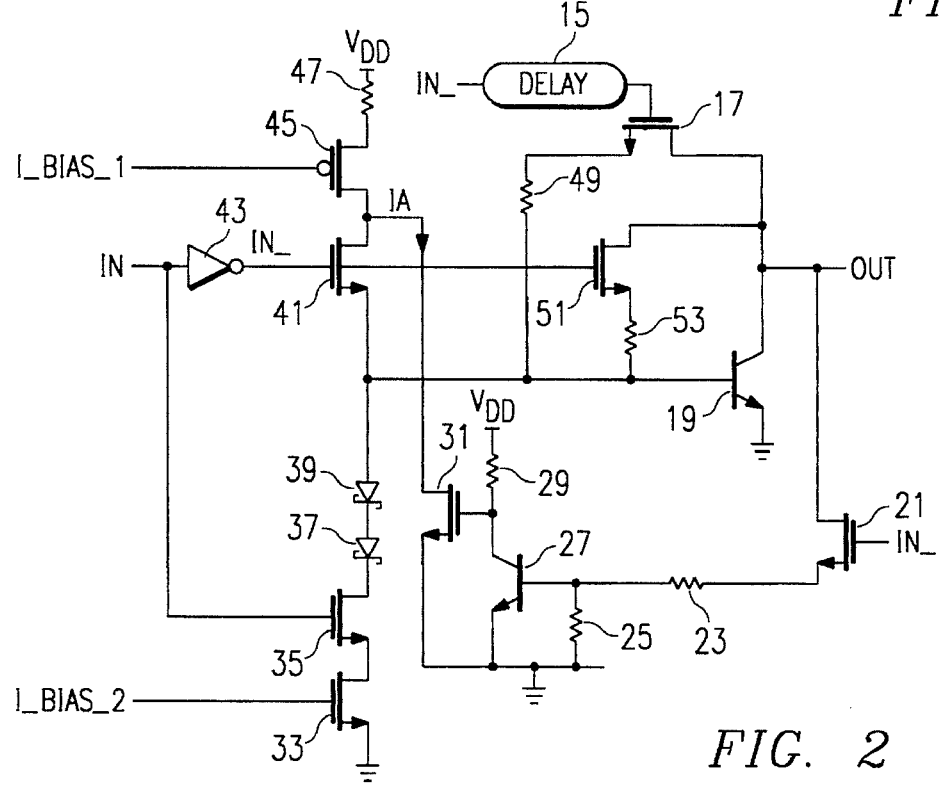
FIG. 2
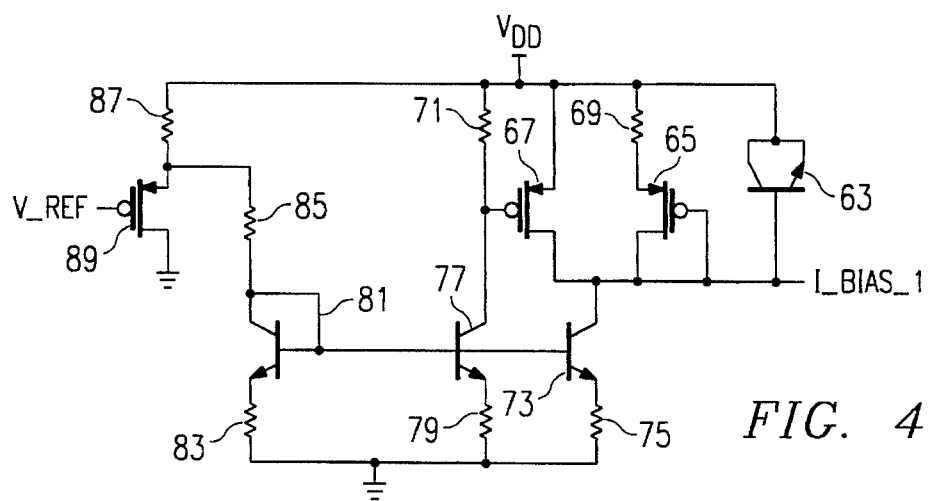
FIG. 4

5,489,862

OUTPUT DRIVER WITH SLEW AND SKEW RATE CONTROL

FIELD OF THE INVENTION

This invention relates generally to integrated circuits for circuits and systems which use high speed, low voltage level busses for data communications, and specifically to the design of output drivers and transceiver devices compatible with low voltage level, high speed data transmission busses.

CROSS REFERENCE TO RELATED APPLICATIONS

This application is related to the co-pending U.S. patent application entitled "Output Driver with Slew Rate Control", filed Oct. 13, 1994, U.S. patent application Ser. No. 08/323,330, TI Docket No. TI-19325, and assigned to Texas Instruments Incorporated, herein incorporated by reference.

BACKGROUND OF THE INVENTION

In increasing the data throughput rate for bussed systems, such as processors, memories, personal computers and computer systems, the use of low signal level data transmission busses has been proposed. By reducing the high output voltage level standard for a particular bus, the switching time is improved because the voltage swing from a high output level to a low output level is limited to a few hundred millivolts, as opposed to the older bus standards which required as much as 5 volts of swing to transition from a high voltage state to a low voltage state. The Futurebus standard, for example, has a reduced high level output voltage, a tight specification requirement on the slew rate of the output devices, and a tight specification requirement of the skew, that is the difference between the low-to-high delay. Also, the output drivers are required not to pull the bus below a certain defined low output level voltage, so that the voltage swing is required to be between two tightly defined high and low voltage levels. The bus specification also requires that the output devices be open-collector or open-drain types, that is the bus is pulled up to the high output state by an external R-C network. The output drivers must then overcome these pullup circuits to assert a low voltage level on the bus.

The problem in implementing low voltage level signal busses like the Futurebus using the circuits of the prior art is that switching noise produced by the output driving devices can cause erroneous results in the signal receiving devices. The noise problem is worse for these busses than for older bus standards because the available noise margins have been greatly reduced. If the device driving the bus switches quickly from a high state, that is letting the bus rise to a defined high output level, to a low state, that is outputting a signal of approximately zero volts, ringing may occur on the bus. This ringing can cause the receiving devices to erroneously input a transient as true data, that is the ring can look like a zero state on the bus followed by a high state, then a second zero state. The ringing is caused because the transition from the high state to the low state by the output driver is happening too sharply. This problem is often stated as a slew rate of the output driver device which is too fast.

Further, prior art circuits which address the slew rate problem often only affect it in one direction, that is the slew rate is lowered for the falling edge, for example, but the rising edge is unaffected. This has the effect of increasing the skew rate, the difference between rising and falling transition times, and thus takes the device further away from the bus requirements.

FIG. 1 depicts an exemplary prior art circuit for driving a Futurebus interface. Output buffer 1 is a BiCMOS output driver which includes an input IN for receiving the data to be transmitted on the bus, an inverter 3 for driving the output driving transistor 9, typically an open collector bipolar transistor, as shown here, a base resistor 5 coupled between the inverter 3 and the output driving transistor, and an N channel transistor 7 for feeding the current at the output node into the base of the bipolar transistor 9.

In operation, the circuit of FIG. 1 drives the bus represented by resistor 11 and impedance 13 as follows. Assume initially that the bus is at the high output voltage defined for the Futurebus, e.g. 2.1 Volts, which translates to a high input voltage at the IN terminal. Now assume the IN terminal sees a transition to a low logic level. The inverter 3 responds by outputting a logic one to the base of output transistor 9 and to the gate of N channel transistor 7. As current flows into the base resistor 5, the bipolar transistor 9 moves out of cutoff to a conductive state, so that the collector coupled to the output terminal begins conducting current into the collector, out through the emitter and to ground. Since the output terminal is at a high voltage of 2.1 Volts, the N channel transistor 7 begins taking additional current through its conductive path into the base of bipolar transistor 9, helping to rapidly discharge the output terminal and to provide additional base current to bipolar transistor 9.

When the input terminal IN transitions back to a high logic level, the inverter 3 will output a low logic level voltage and the N channel transistor 7 will cut off. Also the base of bipolar transistor 9 will now be at a low voltage and bipolar transistor 9 will cutoff. The output terminal OUT will then rise to the voltage provided by external pullup resistor 11.

The prior art circuit of FIG. 1 has several problems. There is minimal control of the slew rate of the output terminal. The slew rate of the circuit of FIG. 1 will primarily be determined by the bipolar output driving transistor 9, which will probably be too fast and create transients at the output terminal. Also, the low output voltage will fall to a level of a voltage which is a Vbe drop above ground plus a minimal voltage across the N channel device, which will be lower than is specified for Futurebus applications. Because the rise time of the signal at the OUT terminal is controlled only by the external resistor and load, there is also no skew control, that is there is no relationship between the fall time for the output voltage at the OUT terminal from a high to low output voltage and the rise time from a low to high output voltage.

The proposed high speed bus standards like the Futurebus require output driving circuitry that has a fast transition time and a tightly controlled slew rate and skew, so that switching noise does not exceed the reduced noise margins. In addition, the Futurebus standard requires control of the low output voltage level. The prior art circuitry cannot provide a solution that meets the requirements of these proposed busses. A need for a circuit having fast switching speed and improved slew rate, skew and low output voltage control with low noise characteristics thus exists.

SUMMARY OF THE INVENTION

Generally, and in one form of the invention, a circuit and method for an output driver with controlled slew rate for both the high to low and low to high output transitions and an overall fast output transition time is provided. This circuit provides skew control so that the rise time and fall time are within a certain minimum range. The circuit also provides continuous feedback compensation of the low output voltage to keep the low output voltage level within a desired range. The circuit of the invention includes a current source coupled to the base of an output driving transistor, the current source being biased by a stable bias reference circuit which will provide a controlled current and voltage to the current source across temperature, supply and process variations. The current source provides a predetermined amount of driving current to the output transistor. The base of the output transistor is further coupled to a slew rate control circuit that provides a controlled current supply to the driving transistor when the output is to transition from a high to a low state. The slew rate control circuit has a separate discharge circuit so that the low to high transition time of the output transistor is also controlled, providing skew control. The circuit also includes a feedback compensation circuit that senses the low output voltage and adds or subtracts driving current to the output driving transistor to keep the low output voltage level within a specified range. The slew rate control circuitry allows the output driving transistor to begin the high to low transition quickly, and then controls the slew, so that the overall propagation delay through the circuit remains faster than prior art slew rate controlled output circuits. A second embodiment of the circuit is provided which further refines the feedback circuitry and provides an alternative compensation circuit for the low output voltage level.

BRIEF DESCRIPTION OF THE DRAWINGS

In the drawings:

FIG. 1 depicts a prior art BiCMOS output circuit;

FIG. 2 depicts a first preferred embodiment of an output driver circuit which incorporates the current source, feedback compensation, and slew rate control circuitry of the invention;

FIG. 3 depicts the circuit detail of a first portion of the bias generator circuit of the first preferred embodiment invention;

FIG. 4 depicts the circuit detail of a second portion of the bias generator circuit of the first preferred embodiment of the invention;

Corresponding numerals and symbols in the different figures refer to corresponding parts unless otherwise indicated.

DETAILED DESCRIPTION OF PREFERRED EMBODIMENTS

Figure 5:
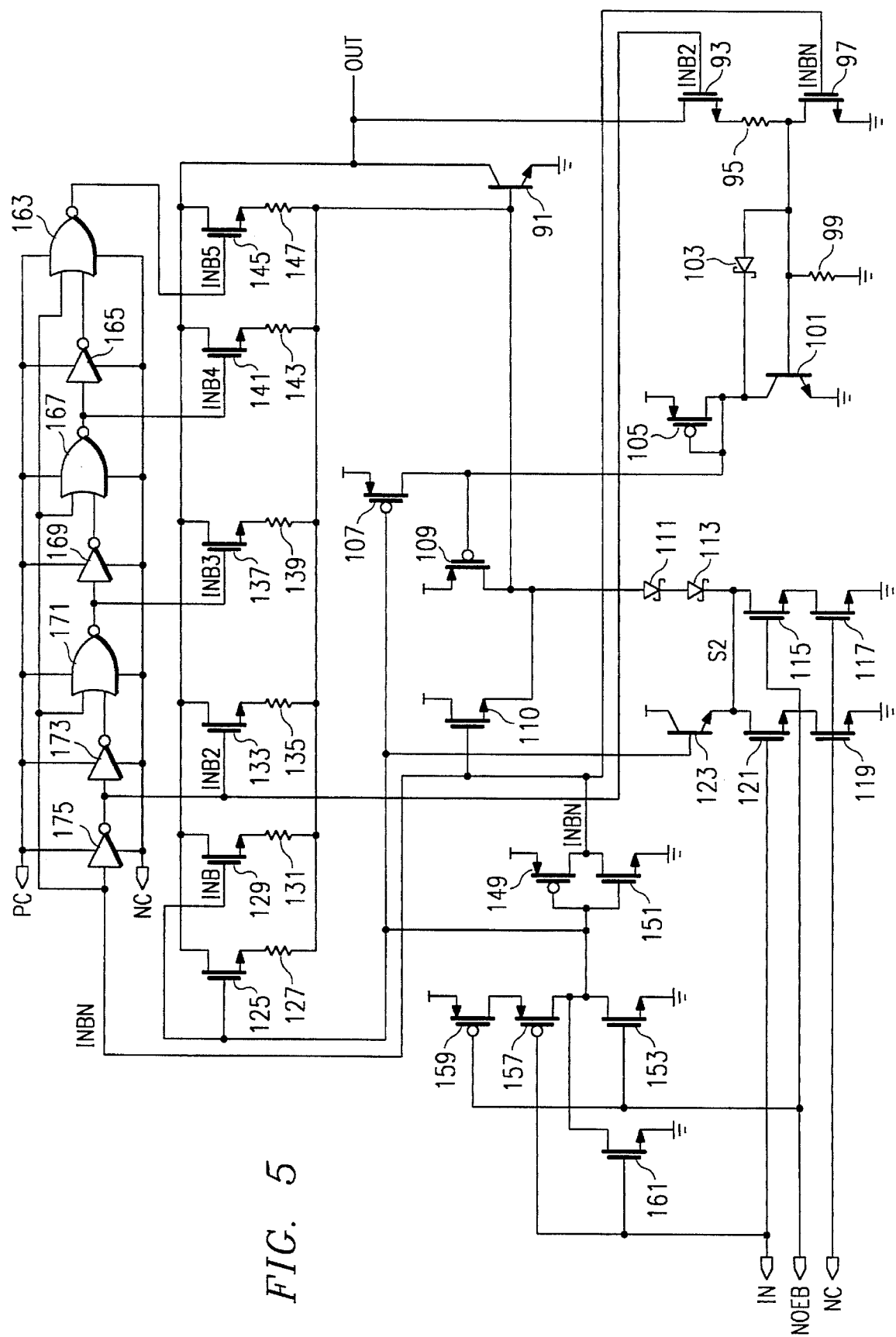
FIG. 5 depicts the circuit detail of a second preferred embodiment of the output circuit of the invention.

FIG. 2 depicts a first preferred embodiment of an output driving circuit incorporating the circuitry of the invention. Output transistor 19 is a large driving transistor, typically an NPN bipolar transistor. The output terminal labeled OUT is coupled to a high speed, low voltage level bus having external pull up termination circuitry, which is not shown. The conductive path of the output transistor 19 couples the output terminal to ground. The base of output transistor 19 is coupled to the output of a current source structure comprised of transistors 41 and 45. The base of the output transistor 19 is further coupled to two speed up circuits: a first speed up circuit comprised of transistor 51, which is controlled by the output of inverter 41, and resistor 53; and a second speed up circuit comprised of transistor 17, delay element 15, and resistor 49. Both of the speed up circuits couple the output terminal back to the base of the output transistor to provide additional drive current during a high to low output transition. The base of output transistor 19 is also coupled to base discharge circuitry made up of Schottky diodes 39 and 37, and a current sink circuit including transistor 35 and transistor 33. The collector of output transistor 19 is coupled to the output terminal labeled OUT and to the low voltage level compensation circuitry made up of transistor 21, resistors 23 and 25, bipolar transistor 27, resistor 29, and resistor 31, which is coupled to the current source circuitry of transistors 45 and 41. Resistor 47 acts as a current limiter for the current source circuit of transistors 45 and 41.

In operation, the bus coupled at the OUT terminal will rise to a high voltage level when there is no active driving output driver on the bus. When a driving transistor asserts a low voltage on the bus, the driving transistor pulls down the bus by coupling the bus to ground. Assume initially that the bus begins in a high voltage level, that is the signal at the data input IN is a high voltage, and output transistor 19 is cutoff, the discharge circuitry of transistors 35 and 33 and diodes 39 and 37 bringing the base of transistor 19 to a predetermined low voltage level, but a predetermined voltage above ground so that the rise time of the base at the next transition is reduced. Now assume a transition occurs at the IN input to a low voltage level. Inverter 43 now puts out a high voltage. Transistor 41 is enabled, which allows the conductive path through the current source of resistor 47 and transistors 45 and 41 to begin pulling up the base of transistor 19. The rate at which the base of transistor 19 will rise is determined by the amount of drive available, which is controlled by the level from the I_BIAS_1 input coupled to the gate of transistor 45 and the value of resistor 47. Controlling the bias level at the input I_BIAS_1 will therefore allow control of the base voltage rise time for the output transistor 19.

Once the base of transistor 19 starts to rise, the transistor will remain in cutoff until the base-emitter threshold voltage of transistor 19 is exceeded. In order to speed up the turn on of the driving transistor 19, speed up circuits are used. Transistor 51 will turn on in response to the high voltage output by inverter 43. This will feed current from the high potential at the OUT terminal into the base of transistor 19. The amount of current fed into the base will determine the rise time of the base voltage of transistor 19, which in turn will control the slew rate for the falling output transition at the OUT terminal. Transistor 51 is used to control the slew rate. While this feedback path will speed up the initial transition at the OUT terminal, as the OUT terminal falls in response to the turn on of transistor 19, the amount of current available at the base of transistor 19 will also fall, thus reducing the available drive from transistor 19. Under certain load and temperature conditions, the output voltage at the OUT terminal will remain too high if no further drive is provided. The second speed up circuit of transistor 17, resistor 49, and delay element 15 is used to compensate for this reduced drive. A predetermined time after the inverter 43 outputs a high logic level, the delay element 15 puts a high logic level at the gate of transistor 17, and additional current is now fed into the base of output driving transistor 19. Transistor 17 controls the amount of current fed into the base by this second speedup circuit. By carefully designing these two speed up circuits, control of the fall time at the output terminal OUT will be achieved.

After the desired output level at the OUT terminal is reached, the output driver circuit of FIG. 2 must keep the bus low output voltage from falling too low. The bus specification calls for a low output voltage above ground, nominally 1 V, so that when the bus is switched back to a high output level the transition time will be reduced. If the bus falls too low, the pull up circuit must overcome this lower voltage on the next transition to a high state. Output level compensation is provided by transistor 21, resistors 23 and 25, bipolar transistor 27, pullup resistor 29, and current sinking transistor 31.

Normally, the current flowing through the current source of transistors 45, 41 and resistor 47 flows into the base of transistor 19, which is now holding the bus in a low output state by coupling the output OUT to ground. However, some of the current is also taken through current IA in the figure to current sinking transistor 31. The balance between the current IA and the current through transistor 41 into the base of transistor 19 will control the output voltage at the output terminal OUT. Resistor 29 provides a nominal high voltage at the gate of transistor 31. When the output voltage at terminal OUT falls below a predetermined threshold level, the voltage divider made up of resistors 23 and 25 will provide a voltage at the base of bipolar transistor 27 that is too low to achieve turn on, that is transistor 27 will cut off. In this case, the gate of current sink transistor 31 will be fully on, and IA will be at its maximum. This results in a reduction of current into the base of transistor 19, which will reduce its drive and thus the voltage at the OUT terminal will rise.

When the OUT terminal reaches a voltage that is higher than a desired predetermined threshold, the resistor voltage divider consisting of resistors 23 and 25 will provide a voltage at the base of transistor 27 that exceeds its turn on voltage and the gate of current sinking transistor 31 will be coupled to ground, that is pulled low. Transistor 31 will then cut off, and the current IA will be zero. Now the entire current supplied to transistor 45 will be gated into the base of transistor 19, the drive will increase, and the voltage at the OUT terminal will fall as a result. Thus the balance of the current flowing into the IA path with the current supplied by the current source circuitry into the base of transistor 19 keeps the output voltage in a defined range when the input IN is at a low level. Transistor 21 is used to enable and disable this compensation circuitry, so that the compensation only occurs during low output voltage conditions.

The current supplied to the base of output transistor 19 during low output voltage level conditions is controlled by the bias current supplied into transistor 45. This bias current is provided by a bias generator circuit to be described later herein. The bias generator circuit is set up to compensate for variations in process, supply voltage, and temperature in such a way that if the transistors on a particular part are weak, the current supplied is increased; conversely if the transistors on a particular part are stronger, the current supplied is decreased, so that the slew rate at the OUT terminal remains fairly constant in spite of these variations. Similarly the bias circuit 25 also compensates for variations in temperature and the supply voltage levels.

To continue the discussion of the operation of the circuit of FIG. 2, now assume that the IN input terminal transitions from a low level to a high voltage level. The output of inverter 41, node IN_, is now a low voltage level. As a result, the speed up circuits of transistors 17 and 51, the compensation circuitry gated by transistor 21, and the current source of transistors 45 and 41 are all turned off. The voltage at the base of output transistor 19 is initially at a high level which was determined by all of the components described above. Transistors 33, 35 and diodes 37 and 39 now provide a discharge path for the base of transistor 19. Without this discharge path, the base would eventually discharge through the emitter of transistor 19, but not for a long time. The rise time of the bus coupled to terminal OUT will be determined by the external pull up circuit, the bus impedance, and the cut off time of transistor 19, which is determined by the slew rate of the fall time of the voltage at the base of transistor 19. In the circuit of FIG. 2, this slew rate is controlled by the current sinking capacity of the transistors 33 and 35 and diodes 37 and 39. The current input into the gate of transistor 33 is the key to controlling this slew rate. This current, I_BIAS_2, is output by another bias generator circuit to be described below. The bias generator circuit is also set up to compensate for variations in process values, temperature and voltage supply so that the slew rate for the rising voltage at the base of output transistor 19 is fairly constant, in spite of variations in these parameters. As a result, the circuit of FIG. 2 provides an output rise time at the OUT terminal that can be controlled to a predetermined time and which will remain steady in spite of these variations. Schottky diodes 39 and 37 are used to hold the base voltage at a low level that is a predetermined amount above ground. That is, once the base of transistor 19 is fully discharged, the voltage at the base will be equal to 2 Schottky forward voltages, one for each diode, plus 2 Vds voltages, one for each of transistors 35 and 33. By setting the low base voltage at a point above ground, the rising transition is enhanced because when the input IN transitions again, the base of transistor 19 is already at a point higher than the minimum voltage, thereby reducing the time to bring transistor 19 out of cutoff, and thus enhancing the fall time of terminal OUT.

In summary, the advantageous slew rate and skew control of the output driving circuit of FIG. 2 is obtained in several ways. First, the selection of the level of current to be provided by the bias generator at the I_BIAS_1 input to the current source transistor 45. Second, by the selection and sizing of transistors 17 and 51 of the two speed up circuits for speeding up the high to low output transition, and the selection of transistors 17 and 51 for controlling the amount of current through these paths, and also the selection of the length of the delay provided by delay element 15 before the second speed up circuit kicks in. The high to low transition is also controlled by setting the threshold where the low voltage level compensation circuit of transistors 31 and 27 will kick in, by the selection of the resistors 29, 25 and 23. The rise time of the output of driving transistor 19 is essentially governed by the fall time of the base voltage. This is primarily governed by the selection of the amount of current to be supplied to the current sinking transistor 33 which is governed by the design of the bias generator circuit which is described below.

As will be understood to those practitioners skilled in the art, the circuitry of FIG. 2 can be modified in several ways without changing the basic operation of this preferred embodiment of the invention, and this description and the claims contemplate and include these modifications. The output driving transistor 37 is shown as an open collector bipolar device. An open drain MOS device will operate in the same general manner. The resistances may be provided using any number of circuit design techniques well known to those skilled in the art. Trimming techniques can be used to compensate the resistances for process variations, as are well known. Various combinations of different sizes of transistors may be used. PMOS and NMOS devices may be switched or substituted for one another without changing the operation of the preferred embodiment. Although a circuit compatible with a BiCMOS process is shown, a pure CMOS, NMOS, or bipolar variant can be easily created using well known design techniques, all of which still embody and use the invention. The diodes shown may be fabricated as diodes or as diode connected transistors of hither MOS or bipolar types. Inverter 43 is used only as an example input gate, and if enable control is needed it may be substituted with a logical equivalent, such as an AND, OR, or NOR gate.

FIG. 3 depicts a first preferred embodiment for a bias generator to be used with the output driver circuit of FIG. 2 to provide the current I_BIAS_2, which is used to supply the current sinking transistor 33 of FIG. 2, and therefore controls the slew rate of the rising output voltage transition. Of course, other embodiments are alternatives, however the embodiment of FIG. 3 has been determined to provide a constant current largely independent of three important variables: supply voltage, process variation, and operating temperature. The independence of the current supplied to the transistor 33 across these variances is critical to proper circuit operation and high yield of fabricated devices, which translates to a lower cost device. Bias circuit 60 of FIG. 3 has a voltage reference input V_REF_2, which for Futurebus applications is usually around 2.7 V, and is taken from a bandgap reference. This voltage is divided across diode 55 and resistor 57, capacitance 59 and diode connected transistor 61. Diode 55 provides thermal compensation, as the operating temperature rises this diode helps stabilize the current out and therefore the high to low slew rate of the circuit of FIG. 2. The capacitance 59, shown here as a bipolar transistor with a common collector-emitter terminal tied to ground, acts as a noise filtering capacitor. Diode 55 provides thermal compensation, as the temperature get higher on the chip, diode 55 allows more current to flow in the current mirror formed by transistor 61. Conversely, as the temperature gets lower, diode 55 allows less current to flow into the current mirror formed by transistor 61. Resistor 57 is used to set the current, and can be trimmed or sized after manufacture using other well known techniques to compensate for process variations. Through the use of these compensation devices, the bias circuit of FIG. 3 will maintain this slew rate across a range of variations in process parameters, temperature and supply voltage; which in turn maintains a steady slew rate for the low to high output transition of the circuit of FIG. 2.

FIG. 4 depicts the second bias generator circuit used in conjunction with the preferred embodiment of FIG. 2. The circuit of FIG. 4 outputs the current I_BIAS_1 in FIG. 2, which is the current used to supply the base of the output transistor during output voltage high to low transitions. This current is critical to the skew and slew rate of the circuit. The circuit of FIG. 4 is used because it has been shown to reliably produce a constant current at the output in spite of process, temperature and supply voltage variations. The circuit is referenced to a voltage V_REF, which is typically about 1.5 V for the Futurebus application; other voltages can be more appropriate in other applications. The reference voltage is used with the gate of transistor 89 to produce a reference level reflected against Vcc. The current is divided through resistors 87 and 85. This current is mirrored through the bipolar current mirror formed of transistors 81, 77, and emitter resistors 83 and 79. The current flowing through resistor 71 is then mirrored and divided by transistor 67 and bipolar transistor 73 with emitter resistor 75. Transistors 67 and 73 are balanced against each other to provide process control. The size of transistor 67 is critical to providing stability of the output over temperature and voltage variations. This transistor matches transistor 45 of FIG. 2. Transistor 67 of FIG. 4 actually sets the current level of I_BIAS_1, but bipolar transistor 73 and resistor 75 provide process control. If the transistors are strong, or the resistances low, more current flows into transistor 73 and less to the output node I_BIAS_1. Conversely, if the process is weak, or the resistances are high, the current is directed more to the output node I_BIAS_1. Transistor 65 provides the current mirror that FIG. 2's transistor 45 references against. Capacitance 63, shown here as a bipolar transistor with a common collector-emitter terminal tied to Vdd, acts as a noise filter and flattens the output signal when the voltage supply has noise in it.

FIG. 5 depicts a second preferred embodiment of the output driving circuit. In FIG. 5, transistor 91 is the output driving transistor which is coupled to the output terminal OUT. Transistors 125, 129, 133, 137, 141, and 145, combined with respective resistors 127, 131, 135, 139, 143, and 147, form feedback paths which are more refined than the feedback circuitry of FIG. 2, but which operate in a similar fashion. Delay elements 175, 173, 171, 169, 167, 165, and 163 operate to enable each of the feedback transistors in sequence, each becoming active after a predetermined delay following a transition at the input. Transistors 93, 97, 101, and 105, in combination with the current source formed by transistors 107, 109 and 110, operate to compensate the output voltage when the output level is low, similarly to the compensation circuitry of FIG. 2, but using a slightly different technique. Resistors 95 and 99, and diode 103, are also part of the compensation circuitry. Transistors 115, 117, 119, 121 and 123, with diodes 111 and 113, are used to discharge the base input node of output transistor 91 in response to an input transition, which will result in a high output voltage level. Transistors 149 and 151 form an inverter used to create the node INBN, which is used to control the gates of certain transistors. Transistors 153, 157, 159 and 161 form an NOR gate between two input terminals, IN, and NOEB.

The circuit of FIG. 5 will place a low voltage onto the OUT terminal, that is sink current through transistor 91, when both the IN and the NOEB terminals are low. The overall circuit equivalent for the circuit of FIG. 5 is therefore an OR gate. Assume for this discussion that initially the NOEB input is low, and the IN input is high. The IN terminal is coupled to the gate of transistor 121, which discharges the base of the bipolar output transistor 91, so that the output voltage rises to the value set by the external termination circuitry. The gate of transistor 119, which is in series with transistor 121, is coupled to a bias voltage NC. This bias voltage is used to control the rise time of the output terminal OUT, by controlling the rate at which the potential at the base of output transistor 91 is discharged. The transistor 119 and the bias input NC therefore control the rise time characteristics of the circuit of FIG. 5 in response to a rising input signal at the IN terminal. Now the IN terminal transitions to a low logic level. Transistor 159 is enabled, since the NOEB terminal is a zero. Transistor 153 is shut off for the same reason. This means that transistors 157 and 161 act as a CMOS inverter coupled to the IN terminal. Thus when IN transitions to a zero, the INB node coupled to the output of the NOR gate formed of transistors 157, 159, 161 and 153 transitions to a one. Transistors 125 and 129 are now enabled, and feed back current from the output terminal OUT to the base of the output driving transistor 91. Transistors 149 and 151 form an inverter which drives node INBN in FIG. 5. As node IBN is a one, this node is a low voltage or logic zero. Accordingly, P-channel MOS transistor 107 is enabled, and N-channel MOS transistor 110 is disabled. The amount of current available to the base of output transistor 91 is now controlled by the feedback transistors, such as transistors 125 and 129, the feedback resistors such as resistors 131 and 135, and the gate of PMOS transistor 109. If transistor 109 is enabled, additional current is available to the base of transistor 91. If this transistor is disabled, less current is available to the base of transistor 91.

The feedback circuitry of FIG. 5 has several separately enabled feedback circuits that are each enabled one by one after a predetermined delay from the input transition. Delay elements 175, 173, 171, 169, 167, 165 and 163 form a delay chain with different taps. The taps are labeled IBN2, IBN3, IBN4 and IBN5. For a different application, more or less delay taps may be required. As the output terminal OUT falls, the feedback circuitry of transistors 125 and 129 will provide less current to the base of output driving transistor 91. In order to ensure the output terminal continues to fall at the desired rate, and that the desired low voltage level is achieved, additional current is needed. After the INBN node transitions, inverter 175 will output a logic one on the node labeled INB2. This node is coupled to the gate of transistor 133, which with resistor 135 will inject additional current into the base of transistor 91. Similarly, after another predetermined delay, inverter 173 and NOR gate 171 will cause a logic one to be output on node INB3 in FIG. 5, which enables transistor 137 and resistor 139 to feed more current into transistor 91. The same delay/enable cycle occurs for delay elements 169 and 167, and feedback circuitry comprised of transistor 141 and 143, and again for delay elements 165 and 163, and feedback circuitry comprised of transistor 145 and resistor 147. After the OUT terminal falls to its final level, the amount of current available from these feedback circuits will be minimal, and the current into the base of the transistor 91 will be determined by the current source transistor 109, and the low output voltage compensation circuitry.

The delay elements 175, 173, 171, 169, 167 and 163 are critical to the operation of the feedback circuitry of FIG. 5. In order to ensure that the output voltage fall time characteristic remains fairly constant in spite of variations in temperature, voltage supply and process strength, each of the delay elements of FIG. 5 is coupled not to the ground and Vdd power supplies, but to a bias generator circuit to be described below. The reference voltages PC and NC are supplied by the bias generator circuit and are therefore stable in spite of variations in these three parameters, so that the circuit of FIG. 5 operates in a constant manner as a result. Also, the NOR gates are used to shut off the delay chain quickly in response to a transition at the INBN node to a logic one, to prevent the delay chain from interfering with the rising edge of the output voltage.

A few gate delays after the transition at the IN terminal to a low logic voltage, the INB2 signal coupled to the gate of transistor 93 transitions and enables the low output voltage compensation circuitry to start sensing the voltage at the output. Transistor 93 will now allow current from the output terminal to pass through the resistive voltage divider of resistors 95 and 99. When the voltage at the base of bipolar transistor 117 exceeds the turn on threshold voltage Vbe, the transistor 10 1 turns on and current will flow from the transistor 105 into the collector of transistor 10 1. Transistors 105 and 109 form a current mirror, so that when additional current flows through the collector of bipolar transistor 101 through P channel transistor 105, additional current is also drawn through transistor 109 into the base of transistor 91. It can now be understood that as the voltage at the output terminal VOUT rises while the low output compensation circuitry is enabled, the resistor voltage divider of resistors 95 and 99 increases the voltage at the base of bipolar transistor 101, which increases the current through transistor 105 and the mirror transistor 109. This increase in current increases the base current of output transistor 91, and correspondingly lowers the output voltage. Conversely, as the output voltage falls, the voltage at the base of transistor 101 also falls, and the amount of current drawn through the current source transistor 105 falls, so that the amount of current supplied to the base of transistor 91 also falls off, and the output voltage VOUT stabilizes. Thus the low output voltage level is controlled by the sizes of the transistors 105, 109 and 101, and the values of the resistors 99 and 95. The output voltage compensation circuitry will function during the high to low transition to help bring the output voltage to a desired low level, and will continue to compensate the output voltage after the transition. If a change in the load on the bus occurs that causes the output voltage to rise above a desired threshold, the compensation circuitry will supply additional drive to the base of transistor 91 to force the bus lower. Conversely, if the output voltage falls below a certain threshold, the compensation circuitry will reduce the current to the base of the output transistor 91 until the voltage rises back above the threshold. Thus the compensation circuitry of FIG. 5 operates to keep the low output voltage level within a predetermined range. This enables the output driver circuit of FIG. 5 to meet the Futurebus specification for the low output voltage level.

Transistor 123 in FIG. 5 is also used to speed up the start of the high to low output transition. When the IN terminal transitions to a low voltage, the INB node transitions to a high voltage. This provides a source of current to the node S2, which then reverse biases diodes 111 and 113, and thus provides an increase in potential at the base of transistor 91, beginning the high to low transition. Diodes 111 and 113 are used during the high output voltage level to hold the base of transistor 91 above ground by a predetermined amount, so that the next transition of the base of transistor 91 to a high voltage is faster.

When the IN terminal transitions to a high voltage, the output voltage must transition from a low to a high level in response. The base of transistor 91 must drop to a low voltage and transistor 91 must enter cutoff, at which point the rise time of the output will be determined by the external pull up circuitry. After the IN terminal transitions to a high voltage, transistor 121 begins discharging the base of output transistor 91. Feedback transistors 125 and 127 are shutoff by the low voltage at node INB. The delay elements 175, 173, 171, 169, 167, 165 and 163 are shutoff quickly by the high voltage at node INBN. Transistor 107 is enabled and pulls up the gates of current mirror transistors 109 and 105, shutting off the current into the base of transistor 91. Transistor 110 is enabled and provides a weak bias current into the diodes 111 and 113. Transistor 93 is disabled, so no current flows through the output voltage compensation circuitry and it is also shut off. As described above, the rise time at the OUT terminal is determined by the operation of transistors 121 and 119, the diodes 111 and 113, and the bias generator signal NC which is coupled to the gate of transistor 119. As the signal NC is set, so the amount of current sinking into transistor 119 is determined, as is the rate of discharge at the base of transistor 91. The fall time of the base of transistor 91 in addition to the external pull up circuitry will determine the rise time of the output voltage at terminal OUT.

Figure 6:
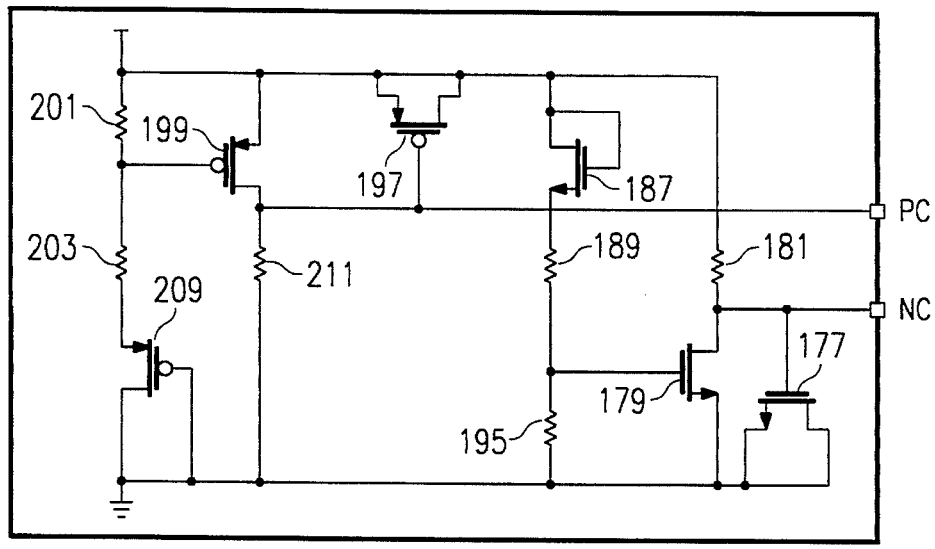
FIG. 6 depicts the circuit detail of the bias generator of the second preferred embodiment of the invention.

FIG. 6 depicts the bias generator circuitry used in conjunction with FIG. 5. Transistors 179 and 187, together with resistors 189, 195, 181 and capacitor 177, are to generate the high voltage reference NC. Transistors 199 and 209, together with resistors 201, 203, 211, and capacitance 197, are used to generate the low reference voltage PC.

In operation, transistor 187 is used with the resistor voltage divider formed from resistors 189 and 195 to create a voltage at the gate of transistor 179. This transistor outputs the voltage NC. The transistor 187 is used against the transistor 179 to compensate the voltage NC for process variations. The voltage NC is used to drive the gates of N channel transistors. Accordingly, if the process parameters are weak, more bias is needed, therefore more voltage should be provided at NC. Conversely, if the process parameters are stronger than nominal, less bias should be provided at NC. This is accomplished by the arrangement of FIG. 6. If the process parameters are weak, transistor 187 will drop more voltage Vgs, the voltage Vgs of transistor 179 will drop, and as a result the current through transistor 179 Ids will be less; so that a higher bias voltage occurs at node NC. If on the other hand the process parameters are strong, the voltage drop across transistor 187 Vgs is less, more voltage appears at the gate of transistor 179, and the output voltage NC drops off to compensate for the stronger process parameters. Temperature variations will be compensated in the same manner. Capacitance 177 dampens any noise at the NC node due to switching noise in the ground plane.

Similarly, transistor 209 and resistors 203 and 201 operate to supply a temperature and process compensated voltage to the gate of output transistor 199, which outputs the low reference voltage PC. The operation of these devices is exactly the same as described above for the N channel devices. Again, capacitance 197 compensates for noise in the Vdd supply due to device switching.

Figure 7:
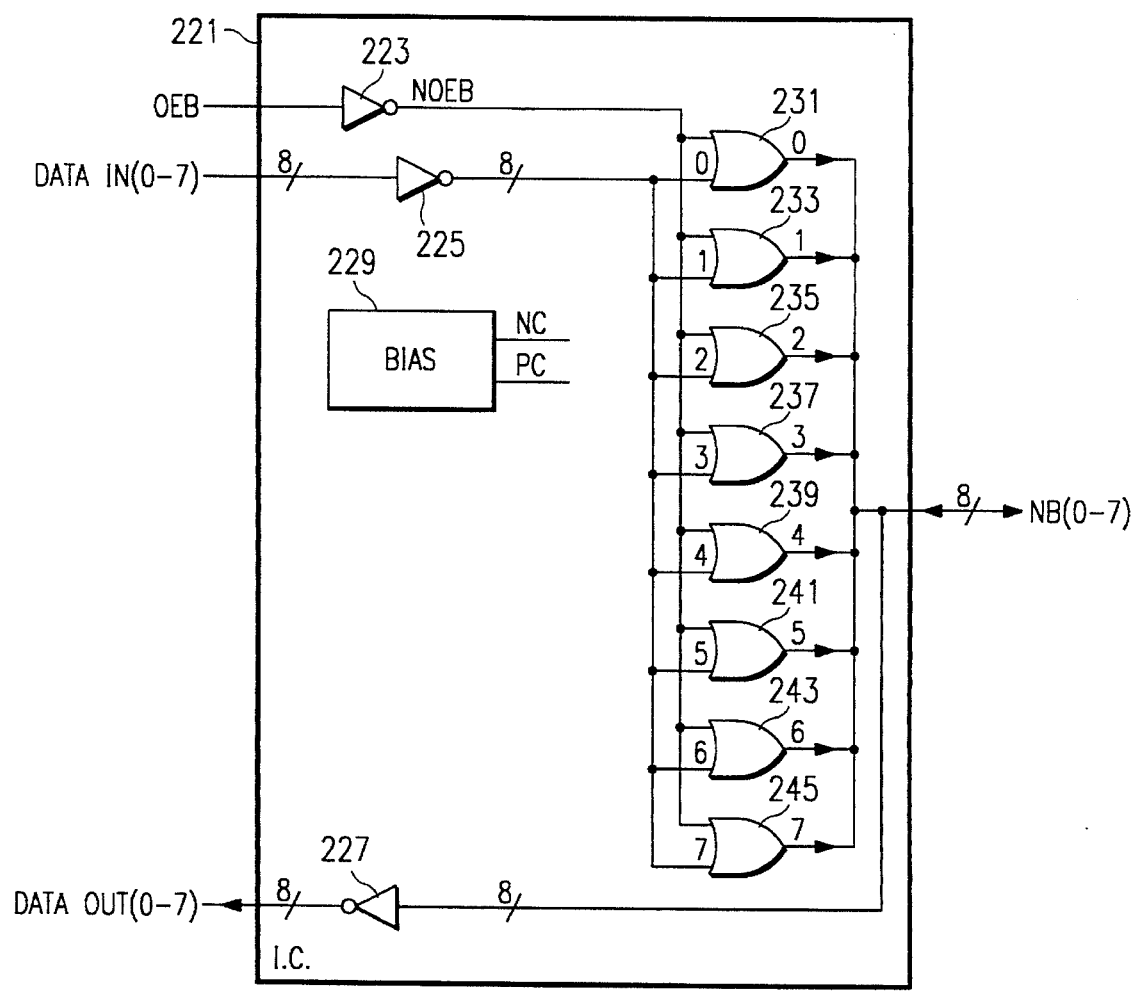
FIG. 7 depicts a transceiver device produced as an integrated circuit which incorporates several of the circuits of FIGS. 5 and 6 as output drivers for the integrated circuit.

A transceiver device compatible with the Futurebus specification has been produced as an integrated circuit using eight of the output drivers of the preferred embodiment of FIG. 5, plus the bias generator of FIG. 6, to drive the output pins. FIG. 7 depicts a simplified block diagram of this integrated circuit 221. An output enable input OEB is buffered through inverter 223. Input data DATAIN(0–7) is an eight bit data input bus which is coupled through inverters 225. The bias generator circuit of FIG. 6 is shown as a bias circuit 229. The output driver circuit of FIG. 5 is used to implement each of the OR gate driver circuits coupled to each data bit 0–7, OR gates 231, 233, 235, 237, 239, 241, 243, and 245 are each coupled to the respective data bit. Each of these driver circuits is coupled to the high reference voltage NC and the low reference voltage PC as shown in FIG. 5. The output terminals 0–7 of these eight OR gate output drivers form an eight bit output bus NB(0–7). The output bus NB(0–7) is further coupled to an eight bit inverter 227 to produce output bus DATAOUT(0–7).

In operation, when the OEB signal is high, the OR gates output drivers 231,233, 235,237,239, 241 and 245 are enabled to drive the eight data bits output from inverter 225 onto the bidirectional bus NB(0–7). When the OEB input signal is low, the NOEB signal is high, and the active low drivers are disabled; that is the bus NB is allowed to float to its external pull-up value. The data output bus DATAOUT(0–7) merely reflects the current value on the bidirectional bus NB.

The integrated circuits of FIG. 7 have been shown to have a transition time which has a 1 nanosecond minimum, a two nanosecond typical, and a three nanosecond worst case, which meet the requirements for the proposed high speed low voltage level busses. The slew rate control circuitry produces a high to low transition that will be far less likely to produce noise and transients on the bus than the circuits of the prior art. The skew control circuitry also controls the rising edge of the output voltage to maintain the required skew for the Futurebus specification. The compensation circuitry of the output drivers maintains the low output voltage within a desired range.

Although the embodiments above are discussed in relation to an application of the invention to drive a Futurebus, simple modifications in the size of the devices and the size and number of resistors can be made to modify the preferred embodiments for use in other applications, as will be easily understood by practitioners skilled in the art. For example the number of elements in the delay line of FIG. 5 is easily changed to affect the transition time from high to low. The levels of the bias voltages can be changed to affect the fall and rise times, as required for various applications. The output voltage levels can be changed by changing the sizes of the devices used for the output voltage compensation circuits of either FIG. 2 or FIG. 5.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An output buffer circuit having skew and slew control, comprising:

an output driver transistor coupling an output terminal to a ground terminal responsive to a voltage in excess of a threshold at a base input of said output driver transistor;

first feedback circuitry coupled to said output terminal and said base input for supplying a first current into said base input, said first feedback circuitry supplying said first current in response to a first voltage at an input signal;

second feedback circuitry coupled to said output terminal and said base input, said second feedback circuitry supplying a second current into said base input in response to said first voltage at said input signal;

output voltage compensation circuitry coupled to said circuit output and said base input for supplying a third current into said base input while said output driver transistor is enabled, said third current being supplied when the voltage at said circuit output terminal exceeds a predetermined threshold; and current discharge circuitry which couples said base input of said output driver transistor to a ground voltage for discharging the potential at the base of said output driver transistor in response to a second voltage at said input signal.

2. The output buffer circuit of claim 1, wherein said output voltage compensation circuitry comprises:

a current source being controlled by a bias current to output a predetermined current to said base input of said output driver transistor;

current sensing circuitry coupled to the output terminal, and outputting a voltage proportional to the voltage at the output terminal;

a pull down transistor coupled to said current sensing circuitry, operable to pull down a circuit node in response to the voltage output by said current sensing circuitry; and a current sinking transistor coupled to said current source and having a gate terminal coupled to said circuit node, operable to sink current and thereby limit the current flowing into the base of said output driving transistor in response to the voltage at said circuit node.

3. The output buffer circuit of claim 1, wherein said current discharge circuitry comprises:

a current sinking transistor between said base input of said output driving transistor and ground, and having a gate terminal controlled by a predetermined bias current;

an enable transistor counted between said base input of said output driving transistor and said current sinking transistor, said enable transistor acting in response to a high voltage at said input; and first and second diodes coupled in series between said base input terminal of said output driving transistor and said enable transistor;

said current discharge circuitry operable to sink current from said base input terminal of said output driving transistor at a predetermined rate as determined by said bias current input to said current sinking transistor, said base input terminal being discharged until the voltage at said base input terminal reaches a predetermined voltage above ground, the predetermined voltage being set by the voltage drop across said first and second diodes.

4. The output buffer circuit of claim 1, wherein said first feedback circuitry comprises:

a MOS transistor coupling said circuit output terminal to said base input terminal, and having its gate coupled to said circuit input terminal; and a current limiting resistor coupled between said MOS transistor and said base input terminal;

wherein the value of said current limiting resistor and the size of said MOS transistor cause a predetermined current to flow into the base input terminal of said output driving transistor.

5. The output buffer circuit of claim 1, wherein said second feedback circuitry comprises:

a delay element coupled to said circuit input terminal;

a MOS transistor coupling said circuit output terminal to said base input terminal, and having its gate coupled to said delay element; and a current limiting resistor coupled between said MOS transistor and said base input terminal;

wherein the delay element, the value of said current limiting resistor and the size of said MOS transistor cause a predetermined current to flow into the base input terminal of said output driving transistor after a predetermined time delay following a transition from a high voltage to a low voltage at said circuit input terminal.

6. The output buffer circuit of claim 1, wherein said output driving transistor comprises a NPN bipolar transistor having a collector coupled to said output terminal, an emitter coupled to a ground voltage, and a base coupled to said base input.

7. The output buffer circuit of claim 1, wherein said output driving transistor comprises a PNP bipolar transistor having an emitter coupled to said output terminal, a collector coupled to a ground voltage, and a base coupled to said base input.

8. An output buffer circuit having skew and slew control, comprising:

an output driver transistor coupling a circuit output terminal to a ground terminal in response to a voltage which exceeds a threshold at a base input of said output driver transistor;

a plurality of serially coupled feedback circuitry elements, each coupled to said circuit output terminal and said base input, each for supplying a current into said base input in response to a first voltage at an input, said plurality of serially coupled feedback circuitry elements providing a plurality of predetermined currents into said base input following a low to high transition in the voltage at said input;

output voltage compensation circuitry coupled to said circuit output and said base input for controlling a third current into said base input while said output driver transistor is enabled, said third current being reduced when the voltage at said circuit output terminal is beneath a predetermined threshold; and current discharge circuitry coupled to said base input of said output driver transistor and to a ground voltage for discharging the potential at the base of said output driver transistor in response to a high to low transition in the voltage at said input.

9. The output buffer circuit of claim 8, wherein said output voltage compensation circuitry comprises:

a current source coupled to a supply voltage and being controlled by a current control node to output a current to the base input of said output driver transistor, the amount of current output by said current source being within a predetermined range and being proportional to the voltage level at said current control node;

current sensing circuitry coupled to the circuit output terminal, and outputting a voltage proportional to the voltage at the circuit output terminal; and a pull down transistor coupled to said current sensing circuitry, operable to pull down said current control node in response to the voltage output by said current sensing circuitry;

said pull down transistor varying the voltage at said current control node so that when the voltage at said circuit output terminal exceeds a certain threshold, the current source provides a predetermined current to the base input of said output driving transistor.

10. The output buffer circuit of claim 8, wherein said current discharge circuitry comprises:

a current sinking transistor coupled between said base input of said output driving transistor and a ground voltage, and having a gate terminal controlled by a predetermined bias current;

an enable transistor coupled between said base input of said output driving transistor and said said current sinking transistor and enabled by a high voltage at said input; and first and second diodes coupled in series between said base input terminal of said output driving transistor and said enable transistor;

said current discharge circuitry operable to sink current from said base input terminal of said output driving transistor at a predetermined rate as determined by said bias current input to said current sinking transistor, said base input terminal being discharged until the voltage at said base input terminal reaches a predetermined voltage above ground, the predetermined voltage being set by the voltage drop across said first and second diodes.

11. The output buffer circuit of claim 8, wherein each of said plurality of feedback circuits comprises:

a delay element coupled to said input;

a MOS transistor coupled between said circuit output terminal and said base input terminal, and having a gate terminal coupled to said delay element; and a resistor coupled between said MOS transistor and said base input terminal;

the value of said delay element, said resistor, and said MOS transistor providing a predetermined current into said base input terminal after a predetermined delay following a transition at said input.

12. A method of providing an output buffer with skew and slew rate control, comprising the steps of:

providing an output driver transistor coupling an output terminal to a ground terminal in response to the voltage at a base input;

providing first feedback circuitry coupled between said circuit output terminal and said base input, said first feedback circuitry supplying a first current into said base input responsive to a first voltage level at an input;

providing second feedback circuitry coupled between said circuit output terminal and said base input, said second feedback circuitry supplying a second current into said base input responsive to said first voltage level at said input;

providing output voltage compensation circuitry coupled to said circuit output and said base input for supplying a third current into said base input while said output driver transistor is enabled, said third current being supplied when the voltage at said circuit output terminal exceeds a predetermined threshold; and providing current discharge circuitry coupled between said base input of said output driver transistor and a ground voltage, said current discharge circuitry discharging the potential at the base of said output driver transistor responsive to a second voltage level at said circuit input terminal.

13. The method of claim 12, wherein said step of providing output voltage compensation circuitry comprises the steps of:

providing a current source controlled by a bias current, said current source outputting a predetermined current to the base input of said output driver transistor;

providing current sensing circuitry coupled to the output terminal, for outputting a voltage proportional to the voltage at the output;

providing a pull down transistor coupled to said current sensing circuitry, operable to pull down a circuit node in response to the voltage output by the current sensing circuitry;

providing a current sinking transistor coupled to said current source and having a gate terminal coupled to said circuit node; and operating said current source, current sensing circuitry, said pull down transistor and said current sinking transistor so that when the voltage at said circuit output terminal exceeds a predetermined threshold the current sensing circuitry will cause said pull down transistor to pull down said circuit node and cause said current sinking transistor to sink current, thereby limiting the current flowing into the base of said output driving transistor.

14. The method of claim 12, wherein said step of providing current discharge circuitry comprises the steps of:

providing a current sinking transistor coupled between said base input of said output driving transistor and a ground voltage, and having a gate terminal controlled by a predetermined bias current;

providing an enable transistor coupled between said base input of said output driving transistor and said current sinking transistor and enabled by a high voltage at said input;

providing first and second diodes coupled in series between said base input terminal of said output driving transistor and said enable transistor; and operating said current discharge circuitry to sink current from said base input terminal of said output driving transistor at a predetermined rate as determined by said bias current input to said current sinking transistor, said base input terminal being discharged until the voltage at said base input terminal reaches a predetermined voltage above ground, the predetermined voltage being set by the voltage drop across said first and second diodes.

15. The method of claim 12, wherein said step of providing first feedback circuitry comprises the steps of:

providing a MOS transistor coupled between said circuit output terminal to said base input terminal, and having its gate coupled to said input;

providing a current limiting resistor coupled between said MOS transistor and said base input terminal; and said current limiting resistor and the size of said MOS transistor causing a predetermined current to flow into the base input terminal of said output driving transistor in response to the voltage level at said input.

16. The method of claim 12, wherein said step of providing said second feedback circuitry comprises the steps of:

providing a delay element coupled to said input;

providing a MOS transistor coupled between said circuit output terminal to said base input terminal, and having its gate coupled to said delay element;

providing a current limiting resistor coupled between said MOS transistor and said base input terminal; and delay element, the value of said current limiting resistor and the size of said MOS transistor causing a predetermined current to flow into the base input terminal of said output driving transistor after a predetermined time delay following a transition at said input from a high voltage to a low voltage.

17. The method of claim 12, wherein said step of providing an output driving transistor comprises providing an NPN bipolar transistor having a collector coupled to said circuit output terminal, an emitter coupled to a ground voltage, and a base coupled to said base input.

18. The method of claim 12, wherein said step of providing an output driving transistor comprises providing a PNP bipolar transistor having an emitter coupled to said circuit output terminal, a collector coupled to a ground voltage, and a base coupled to said base input.

19. A method for providing an output buffer circuit having skew and slew control, comprising the steps of:

providing an output driver transistor coupling a circuit output terminal to a ground terminal in response to a voltage exceeding a threshold at a base input;

providing a plurality of serially coupled feedback circuitry elements, each of said plurality of serially coupled feedback circuitry elements further coupled between said circuit output terminal and said base input, and each of said feedback circuitry elements for supplying a current into said base input responsive to a first voltage at an input, said plurality of serially coupled feedback circuitry elements providing a plurality of predetermined currents into said base input following a low to high transition in the voltage at said input;

providing output voltage compensation circuitry coupled between said circuit output terminal and to said base input, said output voltage compensation circuitry controlling a third current into said base input while said output driver transistor is enabled, said third current being reduced when the voltage at said circuit output terminal is beneath a predetermined threshold; and providing current discharge circuitry coupled between said base input of said output driver transistor and a ground voltage, said current discharging circuitry discharging the base of said output driver transistor when a high to low transition occurs in the voltage at said input.

20. The method of claim 19, wherein said step of providing output voltage compensation circuitry comprises the steps of:

providing a current source controlled by a current control node to output a current to the base input of said output driver transistor, the amount of current output by said current source being within a predetermined range and being proportional to the voltage at said current control node;

providing current sensing circuitry coupled to the output terminal, and outputting a voltage proportional to the voltage at the output terminal;

providing a pull down transistor coupled to said current sensing circuitry, operable to pull down the voltage at said current control node in response to the voltage output by the current sensing circuitry; and operating said pull down transistor to vary the voltage at said current control node so that when the voltage at said circuit output terminal exceeds a predetermined threshold, the current source provides a predetermined current to the base of said output driving transistor.

21. The method of claim 9, wherein said step of providing current discharge circuitry comprises the steps of:

providing a current sinking transistor coupled between said base input of said output driving transistor and a ground voltage, and having a gate terminal controlled by a predetermined bias current;

providing an enable transistor coupling said base input of said output driving transistor to said current sinking transistor, said enable transistor having a gate input coupled to said input and being enabled when the voltage at said input exceeds a threshold voltage;

providing first and second diodes coupled in series between said base input terminal of said output driving transistor and said enable transistor; and operating said current discharge circuitry to sink current from said base input terminal of said output driving transistor at a predetermined rate as determined by said bias current input to said current sinking transistor, said base input terminal being discharged until the voltage at said base input terminal reaches a predetermined voltage above ground, the predetermined voltage being set by the voltage drop across said first and second diodes.

22. The method of claim 19, wherein said step of providing each one of said plurality of feedback circuits comprises the steps of:

providing a delay element coupled to said input;

providing a MOS transistor coupled between said circuit output terminal and said base input terminal, and having a gate terminal coupled to said delay element;

providing a resistor coupled between said MOS transistor and said base input terminal; and said delay element, said resistor, and said MOS transistor providing a predetermined current into said base input terminal after a predetermined delay following a transition in the voltage at said input.

* * * * *